United States Patent
Al-Khabbaz et al.

(10) Patent No.: US 11,698,396 B2
(45) Date of Patent: Jul. 11, 2023

(54) ENHANCED BACKWARD/FORWARD SWEEP BASED LOAD FLOW APPROACH FOR EXTENDED RADIAL DISTRIBUTION SYSTEM

(71) Applicant: King Fahd University of Petroleum and Minerals, Dhahran (SA)

(72) Inventors: Mustafa Mohammed J. Al-Khabbaz, Dhahran (SA); Mohammad A. Abido, Dhahran (SA)

(73) Assignee: King Fahd University of Petroleum and Minerals, Dhahran (SA)

(*) Notice: Subject to any disclaimer, the term of this patent is extended or adjusted under 35 U.S.C. 154(b) by 772 days.

(21) Appl. No.: 16/454,786

(22) Filed: Jun. 27, 2019

(65) Prior Publication Data
US 2020/0408815 A1    Dec. 31, 2020

(51) Int. Cl.
*H02J 3/12*    (2006.01)
*G01R 19/25*    (2006.01)

(52) U.S. Cl.
CPC ............ *G01R 19/2513* (2013.01); *H02J 3/12* (2013.01)

(58) Field of Classification Search
CPC .... G01R 19/2513; G01R 19/25; G01R 19/00; H02J 3/12; H02J 3/00; H02J 2203/10; H02J 2203/00
See application file for complete search history.

(56) References Cited

U.S. PATENT DOCUMENTS

| | | | |
|---|---|---|---|
| 11,181,564 B2* | 11/2021 | Ghosh | G01R 21/133 |
| 2013/0024168 A1* | 1/2013 | Ilic | H02J 3/00 703/2 |
| 2013/0030579 A1* | 1/2013 | Milosevic | H02J 3/144 700/286 |

(Continued)

FOREIGN PATENT DOCUMENTS

EP    3 098 924 A1    11/2016

OTHER PUBLICATIONS

Augugliaro et al. "An Efficient Procedure for Solving Radial Distribution Networks through the Backward/Forward Method", Aug. 23-25, 2005, Proceeding of the 5th WSEAS, pp. 483-490 (Year: 2005).*

(Continued)

*Primary Examiner* — Mohamed Charioui
(74) *Attorney, Agent, or Firm* — Oblon, McClelland, Maier & Neustadt, L.L.P.

(57) ABSTRACT

A method of enhanced backward/forward sweep based power flow analysis is described. The method can include performing a backward sweep to determine first branch currents of a radial distribution network based on nodal voltages determined at a last iteration. The radial distribution network can include nodes and branches that are sequentially numbered and belong to different layers. A forward sweep is determined to determine first nodal voltages of the radial distribution network based on the first branch currents. Second branch currents of the radial distribution network are determined based on the first nodal voltages.

(Continued)

The second branch current of the respective node is a sum of a nodal injection current of the respective node that is updated based on the first nodal voltage of the respective node, and if available, the first branch currents of branches emanating from the respective node.

20 Claims, 9 Drawing Sheets

(56) References Cited

U.S. PATENT DOCUMENTS

2016/0036226 A1* 2/2016 Gan .................. H02J 3/00 700/286

OTHER PUBLICATIONS

Teng ; Implementation of a Voltage Sweep Power Flow Method and Comparison with Other Power Flow Techniques ; eeh power systems laboratory ; Nov. 20, 2014 ; 37 Pages.

Shirvastava, et al. ; Review of Forward & Backward Sweep Method for Load Flow Analysis of Radial Distribution System ; International Journal of Advanced Research in Electrical, Electronics and Instrumentation Engineering vol. 4, Issue 6 ; Jun. 2015 ; 5 Pages.

Sunisith, et al. ; Backward/Forward Sweep based Distribution Load Flow Method ; Internation Electrical Engineering Journal, vol. 5, No. 9 ; pp. 1539-1544 ; 2014 ; 6 Pages.

Rupa, et al. ; Power Flow Analysis for Radial Distribution System Using Backward/Forward Sweep Method ; International Journal of Electrical, Energetic, Electronic and Communication Engineering, vol. 8, No. 10 ; 2014 ; 5 Pages.

Setia, et al. ; The Performance Comparison between Fast Decoupled and Backward-Forward Sweep in Solving Distribution Systems ; The 3$^{rd}$ IEEE Conference on Power Engineering and Renewable Energy ; 2016 ; pp. 247-251 ; 5 Pages.

Shirnohammadi, et al. ; A Compensation-Based Power Flow Method for Weakly Meshed Distribution and Transmission Networks ; IEEE Transactions on Power Systems, vol. 3, Issue 2 ; May 1988 ; pp. 753-762; 10 Pages.

Baran, et al. ; Network Reconfiguration in Distribution Systems for Loss Reduction and Load Balancing ; IEEE Transactions on Power Delivery, vol. 4, No. 2 ; Apr. 1989 ; pp. 1401-1407 ; 7 Pages.

Zhang, et al. ; A Distribution Short Circuit Analysis Approach Using Hybrid Compensation Method ; IEEE Transactions of Power Systems, vol. 10, No. 4 ; Nov. 1995 ; pp. 2053-2059 ; 7 Pages.

Ju, et al. ; An Extension of FBS Three-Phase Power Flow for Handling PV Nodes in Active Distribution Networks ; IEEE Transactions on Smart Grid, vol. 5, No. 4 ; Jul. 2014 ; pp. 1547-1555 ; 9 Pages.

Chang, et al. ; A Simplified Forward and Backward Sweep Approach for Distribution System Load Flow Analysis ; International Conference on Power System Technology ; 2006 ; 5 Pages.

Wang, et al. ; Reconfiguration of Distribution Network with Dispersed Generators Based on Improved Forward backward Sweep Method ; IEEE ; 2010 ; 5 Pages.

Kulwinder, et al. ; Optimization and comparison of Distributed Generator in Distribution System Using Backward and forward sweep method; 2016 ; 5 Pages.

Samal, et al. ; A Modified Forward Backward Sweep Load Flow Algorithm for Unbalanced Radial Distribution Systems ; IEEE ; 2015 ; 5 Pages.

\* cited by examiner

TABLE
DEVIATION OF THE LAST TWO ITERATIONS

| System | BFS | EBFS |
|---|---|---|
| 5 | 5.61 | 4.64 |
| 7 | 2.69 | 2.69 |
| 11 | 2.95 | 2.95 |
| 25 | 7.75 | 5.84 |
| 28 | 9.53 | 7.80 |
| 30 | 9.35 | 5.85 |
| 33 | 7.93 | 4.89 |
| 34 | 9.23 | 5.41 |
| 69 | 7.87 | 1.95 |
| Average | 6.99 | 4.67 |

Fig. 5

TABLE
REQUIRED ITERATIONS TO CONVERGE FOR THE TWO METHODS

| System | BFS | EBFS |
|---|---|---|
| 5 | 9 | 9 |
| 7 | 8 | 8 |
| 11 | 9 | 9 |
| 25 | 42 | 10 |
| 28 | 141 | 26 |
| 30 | 44 | 9 |
| 33 | 25 | 5 |
| 34 | 46 | 9 |
| 69 | 50 | 8 |
| Average | 42 | 10 |

Fig. 6

TABLE
ELAPSED TIME TAKEN BY EACH METHOD TO CONVERGE (SECOND)

| System | BFS | EBFS |
|---|---|---|
| 5 | 0.024248 | 0.024915 |
| 7 | 0.020715 | 0.02723 |
| 11 | 0.021658 | 0.029722 |
| 25 | 0.027870 | 0.043076 |
| 28 | 0.039134 | 0.067354 |
| 30 | 0.029935 | 0.049992 |
| 33 | 0.028292 | 0.050972 |
| 34 | 0.038784 | 0.050095 |
| 69 | 0.041999 | 0.170685 |
| Average | 0.030293 | 0.057116 |

ENHANCED BACKWARD/FORWARD SWEEP BASED LOAD FLOW APPROACH FOR EXTENDED RADIAL DISTRIBUTION SYSTEM

BACKGROUND

Field of the Disclosure

The disclosure is related to load flow analysis techniques for extended radial distribution systems in a power grid.

Description of the Related Art

Load flow (or power flow) analysis is performed on an electric power network to determine its steady state performance. The problem consists of identifying the voltage magnitude and phase angle of each bus. This is based on the system parameters (impedances, active & reactive loads and system configuration, etc.). Based on the main results (bus voltage), other system conditions can be obtained including currents, power flows and losses. Load flow analysis provides the basis for effective planning of greenfield or grass-root electrical projects and allows for continuous evaluation and control of existing power systems.

The electric energy chain consists of four main parts; generation, transmission, distribution and end-user. Power distribution system carries electric power from transmission system to end users. Distribution system differs from transmission in several aspects, including system parameters and configuration. Transmission system typically has a meshed topology while a distribution system usually has a radial or weekly meshed topology. Transmission system is typically formed by long high voltage overhead lines with a higher reactive to resistive (X/R) ratio, while distribution system typically includes short medium voltage overhead lines and underground cables which lower the (X/R) ratio. Therefore, Newton Raphson, Fast Decoupling and Gauss Seidel, which are effective in load flow analysis at transmission systems, can fail when applied at distribution systems. Those techniques provide high convergence characteristic in dealing with meshed networks with high X/R radios which is not the case for radial networks with low X/R ratios.

The backward/forward sweep (BFS) method can be successfully applied to load analysis of distribution systems. Studies of BFS based load flow analysis in radial distribution systems were presented in the following works: J. A. M. Rupa and S. Ganesh, "Power Flow Analysis for Radial Distribution System Using Backward/Forward Sweep Method," vol. 8, no. 10, pp. 1537-1541, 2014; D. Shirmohammadi, H. W. Hong, A. Semlyen, and G. X. Luo, "A compensation-based power flow method for weakly meshed distribution and transmission networks," IEEE Trans. Power Syst., vol. 3, no. 2, pp. 753-762, May 1988; M. E. Baran and F. F. Wu, "Network reconfiguration in distribution systems for loss reduction and load balancing," IEEE Trans. Power Deliv., vol. 4, no. 2, pp. 1401-1407, April 1989; Xiaofeng Zhang, F. Soudi, D. Shirmohammadi, and C. S. Cheng, "A distribution short circuit analysis approach using hybrid compensation method," IEEE Trans. Power Syst., vol. 10, no. 4, pp. 2053-2059, November 1995; Y. Ju, W. Wu, B. Zhang, and H. Sun, "An Extension of FBS Three-Phase Power Flow for Handling PV Nodes in Active Distribution Networks," IEEE Trans. Smart Grid, vol. 5, no. 4, pp. 1547-1555, July 2014. Those works are incorporated by reference herein in their entirety.

In addition, several references discussing BFS based load analysis and applying modifications for different purposes are introduced below. In the work of G. Chang, S. Chu, and H. Wang, "A Simplified Forward and Backward Sweep Approach for Distribution System Load Flow Analysis," in 2006 International Conference on Power System Technology, 2006, no. 4, pp. 1-5, a linear proportion concept is adopted to identify a real to imaginary ratio of a voltage to calculate bus voltages. The voltages were updated by multiplying their real and imaginary parts with the corresponding ratios. The work of G. Chang, S. Chu, and H. Wang is incorporated by reference herein in its entirety.

In the work of J. Wang, L. Lu, J.-Y. Liu, and S. Zhong, "Reconfiguration of Distribution Network with Dispersed Generators Based on Improved Forward-Backward Sweep Method," in 2010 Asia-Pacific Power and Energy Engineering Conference, 2010, vol. 2015-September, no. 1, pp. 1-5, a hybrid particle Swarm method was employed to reconfigure distribution networks with distributed power generations. A node-layer incident matrix is used to find the load flow. The work of J. Wang, L. Lu, J.-Y. Liu, and S. Zhong is incorporated by reference herein in its entirety.

BFS was used to perform a load flow analysis on a distribution network with distributed generators in the work of K. Kaur and S. Singh, "Optimization and comparison of distributed generator in distribution system using backward and forward sweep method," in 2016 7th India International Conference on Power Electronics (IICPE), 2016, pp. 1-5, which is incorporated by reference herein in its entirety.

In the work of P. Samal and S. Ganguly, "A modified forward backward sweep load flow algorithm for unbalanced radial distribution systems," in 2015 IEEE Power & Energy Society General Meeting, 2015, vol. 2015-September, pp. 1-5, a power flow technique for unbalanced distribution radial network was introduced which considers the mutual coupling between the phases to obtain higher accuracy. The work of P. Samal and S. Ganguly is incorporated by reference herein in its entirety.

In the work of G. A. Setia, G. H. M. Sianipar, and R. T. Paribo, "The performance comparison between fast decoupled and backward-forward sweep in solving distribution systems," in 2016 3rd Conference on Power Engineering and Renewable Energy (ICPERE), 2016, pp. 247-251, fast decoupled and BFS methods were compared for solving power flows in distribution networks. The work of G. A. Setia, G. H. M. Sianipar, and R. T. Paribo is incorporated by reference herein in its entirety.

SUMMARY

Figure 1:
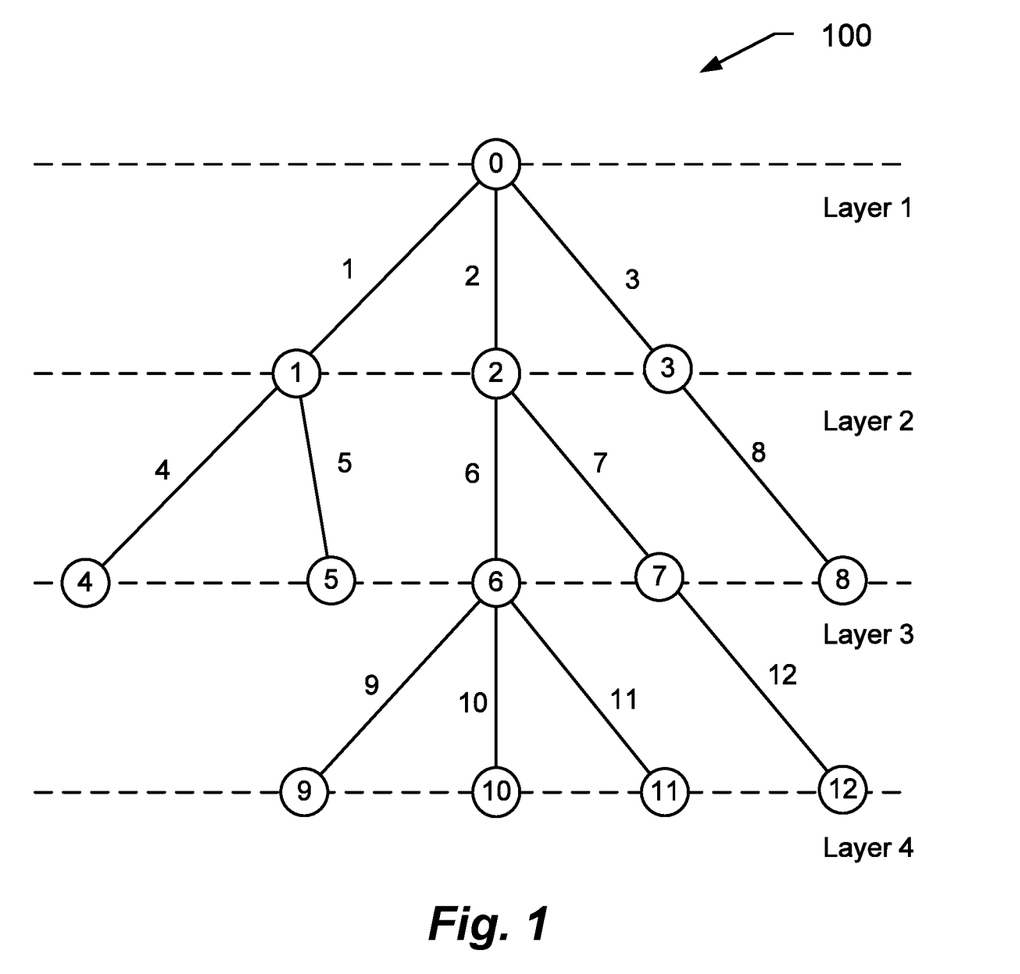
FIG. 1 shows an exemplary radial distribution network 100 according to an embodiment of the disclosure.

Aspects of this disclosure build on the method of backward/forward sweep based power flow analysis. The method's first iteration starts by performing a backward sweep to determine branch currents of the distribution network based on initial load current and nodal voltage values. It starts adding currents from the last layer (refer to FIG. 1) moving to the first layer (bottom up approach). A forward sweep is performed to determine nodal voltages of the radial distribution network based on initial nodal voltage and previously calculated branch currents starting from the first layer to the last layer (top down approach). The radial distribution network can include nodes and branches that are sequentially numbered and belong to different layers as shown in FIG. 1. Second iteration of the method is performed based on nodal voltages and load currents of the first iteration.

In an embodiment, Enhanced Backward/Forward Sweep (EBFS) based load flow provides additional improvement to the conventional BFS. The latter identifies the currents based on the initiations and then based on the calculated voltages. The proposed method updates the currents within each voltage calculation step to accelerate the convergence by reducing the number of iterations. The proposed method includes three components: Forward and backward sweeps in addition to intermediate currents update. In the backward sweep, power formula and nodal analysis are used to calculate the currents at each downstream branch moving toward the root (Swing bus). In the forward sweep, Kirchhoff Current Law and Kirchhoff Voltage Law are utilized to identify the voltages across the upstream buses. It starts with the root, moving toward the tail (end-customer side). During this stage, the currents values will be updated to obtain more accurate voltages as the voltage calculation moves toward the load side.

In an embodiment, to start the current update process, the present iteration currents should be availed by the following formula:

$$I_i^q = \left(\frac{S_i}{V_i^{q-1}}\right)^* + I_k^q$$

where $I_i^q$ represents the current of the i-th branch that is under calculation, q reflects the iteration number, $S_i$ for the load connected to Bus i (top bus), $V_i^{q-1}$ the previously calculated voltage for Bus i, asterisk symbol represents complex conjugate, and $\Sigma_{k=a,b,c, \ldots \, etc} I_k^q$ represents the branch currents of braches emanating from the i-th node.

In an embodiment, the voltage across specific Bus i at Iteration q is provided by the below equation:

$$V_i^q = V_j^q - I_{ij}^q Z_{ij}$$

$I_{ij}$ and $Z_{ij}$ are the current and impedance between buses i and j

In an embodiment, the updated current ($I_i^{q'}$) will be calculated based on the below relation by including the latest corresponding voltage ($V_i^q$) value, $$I_i^{q'} = \left(\frac{S_i}{V_i^q}\right)^* + \sum_{k=a,b,c_j* \, etc} I_k^q$$

where $S_i$ represents a nodal injection power at the i-th node.

In an embodiment, the voltage will be updated using the below equation which incorporates the updated current to get the updated voltage ($V_i^{q'}$).

$$V_i^{q'} = V_j^q - I_{ij}^{q'} Z_{ij}$$

In an embodiment, the current update process will be performed for all buses except the slack bus where its value is controlled by the power source.

In an embodiment, the iteration process terminates when the deviation between the previous iteration voltage and the current one is less than a specific tolerance value. Otherwise, the process will continue to repeat till the convergence takes place In an embodiment, a nodal injection power $S_i$ at the i-th node is determined according to an injection power of a generator connected to the i-th node and a load power of loads connected to the i-th node.

In an embodiment, the radial distribution network is an extended radial distribution network where multi-terminal lines exist.

Aspects of the disclosure provide a non-transitory computer-readable medium storing a program. The program can be executable by a processor to perform the method of enhanced backward/forward sweep based power flow analysis.

Aspects of the disclosure provide an apparatus of enhanced backward/forward sweep based power flow analysis. The apparatus includes circuitry configured to perform a backward sweep to determine first branch currents of a radial distribution network based on nodal voltages determined at a last iteration. The radial distribution network can include nodes and branches that are sequentially numbered and belong to different layers. The circuitry can be configured to perform a forward sweep to determine first nodal voltages of the radial distribution network based on the first branch currents, and determine second branch currents of the radial distribution network based on the first nodal voltages. The second branch current of the respective node is a sum of (i) a nodal injection current of the respective node that is updated based on the first nodal voltage of the respective node, and (ii) if available, the first branch currents of branches emanating from the respective node.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF EMBODIMENTS

An Enhanced Backward/Forward Sweep (EBFS) based distribution system power flow analysis is described in the present disclosure. During an EBFS based analysis process, multiple rounds of iterations can be performed in order to determine voltages at buses in a radial distribution network. On each iteration, current and voltage updating operations can be additionally performed after backward/forward sweep operations have been performed. The updated voltages are used as input of a subsequent iteration. Compared with a normal Backward/Forward Sweep (BFS) based power load analysis method, the addition of the current and voltage updating operations can reduce the number of iterations for the convergence of the load analysis process while improving an accuracy of the power flow analysis. The EBFS can be applied to an extended radial system where multi-terminal lines exist.

I. Radial Distribution Networks

Radial distribution networks have advantages of simple construction and low cost, and can be used to provide economic power supply with an acceptable reliability. For example, radial distribution networks are widely used in sparsely populated areas and remote scattered hydrocarbon facilities.

FIG. 1 shows an exemplary radial distribution network 100 according to an embodiment of the disclosure. The radial distribution network 100 has a tree structure, and includes n+1 nodes numbered from 0 to n, and n branches numbered from 1 to n. In the FIG. 1 example, n takes a value of 12. Each node can represent a bus (or bus bar) that is a conductor or an assembly of conductors for collecting electric currents and distributing the electric currents to outgoing feeders (or branches) connected to the bus. For example, the root node 0 of the tree structure can be a slack bus (or swing bus) at a substation, and functions as a voltage source of the radial distribution network 100. The radial distribution network 100 can receive electric power from a transmission network of a power grid via the root node 0 and distribute the electric power through the branches to each node 1-12 where consumer equipment is connected.

As shown, the radial distribution network 100 has a radial topology in which there are no loops and each bus is connected to the source (the root node) via exactly one path. The nodes and branches connecting two neighboring nodes can be organized in layers. For example, the nodes can be arranged in 4 layers as shown in FIG. 1. The nodes 1-3 are arranged in the second layer (layer 2) while the nodes 4-8 are ranged in the third layer (layer 3). The root node is in the top layer (layer 1) while the nodes 9-12 are in the bottom layer (layer 4). Accordingly, the branches are also organized in layers. For example, the branches between two neighboring layers of nodes can form a layer of branches.

Based on the layered organization, numbering of the nodes and branches can be performed in the following way. The nodes can be numbered sequentially from 0 to n in ascending order from the higher layers to the lower layers. Each branch starts from the sending bus at an upper layer and ends at the ending bus at a lower layer. Each branch can thus be numbered with a number the same as that of the respective ending bus from 1 to n. According to the numbering system, a node with a number of m can be referred to as the m-th node while a branch with number of m can be referred to as the m-th branch that is connected to the m-th node. The numbering system can be used in a BFS or EBFS based load analysis process to define an order of how the nodes and branches are traversed during the backward or forward sweep.

II. Backward/Forward Sweep Load Flow Method

Figure 2:
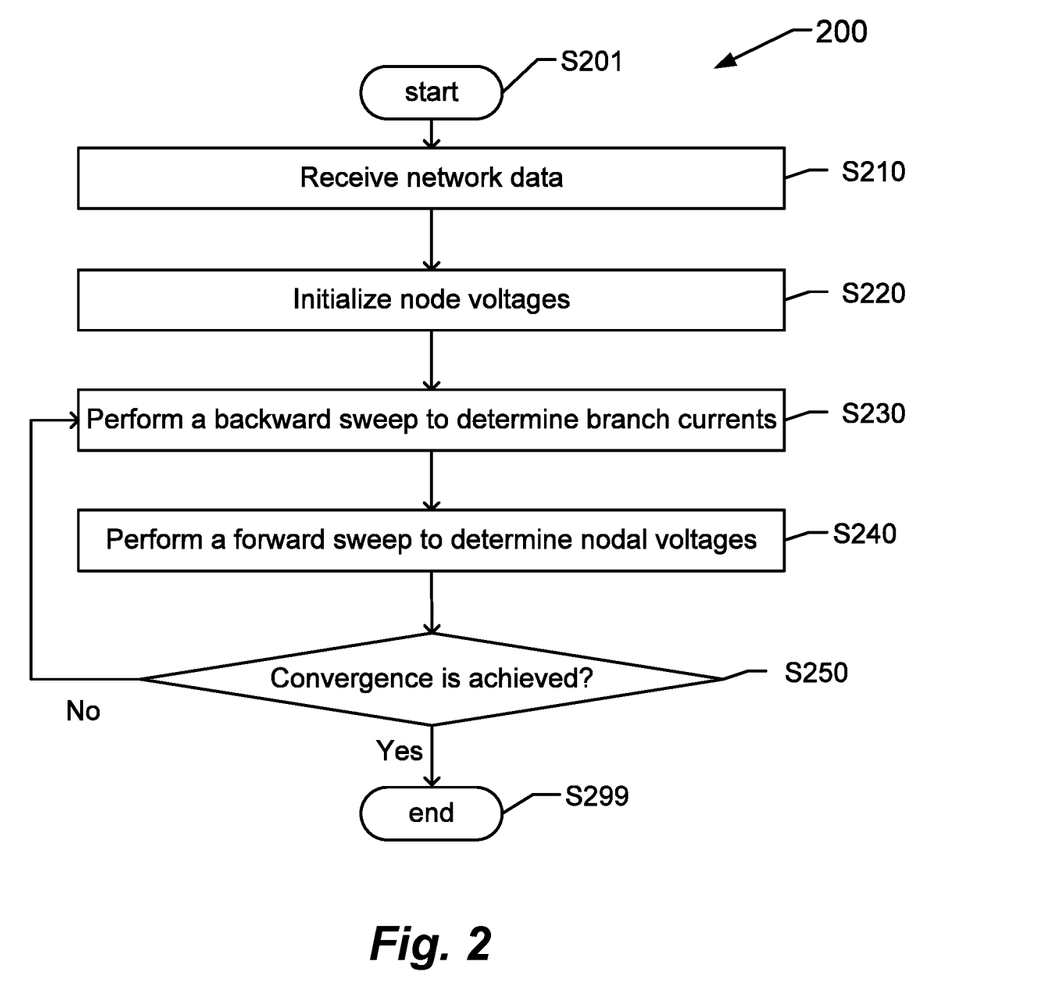
FIG. 2 shows an exemplary backward/forward sweep (BFS) based load flow analysis process 200 according to an embodiment of the disclosure.

FIG. 2 shows an exemplary BFS based load flow analysis process 200 according to an embodiment of the disclosure. The process 200 can be performed over the radial distribution network 100 to determine alternating current (AC) power quantities that indicate a performance of the radial distribution network 100. The process 200 can include multiple rounds of iterations. On each iteration, a backward sweep and a forward sweep can be successively performed, and a difference between quantities computed in the present and the previous iterations is compared with a convergence threshold to determine whether to terminate the process 200. The process 200 can start from S201 and proceed to S210.

At S210, data of the radial distribution network 100 can be received. For example, the data can include information describing the topology of the radial distribution network 100, such as the buses and branches with associate numbers.

The data can further include parameters associated with the buses (or nodes) in the radial distribution network 100. For example, each bus can be associated with a complex power and a complex voltage indicated by four variables: a real (or active) power, a reactive power, a voltage magnitude, and a voltage angle. For the slack bus of node 0, the complex voltage including the voltage magnitude and the voltage angle can be provided. For the buses connected with loads (e.g., consumer equipment), the complex power including the real power and the reactive power of the loads can be provided. For the buses connected with a generator, the active power and the voltage magnitude can be provided.

In addition, the data can include impedances of each branch in the radial distribution network 200. The data can also include values of admittances of shunt elements associated with each branch or node. The branch impedances can cause power losses in the radial distribution network 100, and the admittances can cause shunt currents emitting from the respective branches or nodes.

In one example, the subsequent BFS based computation can be performed with the specified values of the above bus, branch, and shunt element parameters as input. Those parameter values do not change during the process 200 in one example.

At S220, the voltages of the nodes except the root node can be initialized, for example, with a guessed value. In one example, the nodal voltages are each initialized with a value of 1 per-unit (pu) which is used as a starting point of the iterative process 200.

At S230, the backward sweep can be performed to determine currents of the branches in the radial distribution network 100 based on the initial nodal voltages or nodal voltages from a previous iteration. For example, computations of the branch currents can start from the branches connected to the nodes at the last layer (layer 4), and move backward (or upward) until the branches connected to the root node are reached. For example, in the FIG. 2 example, the branches of the radial distribution network 100 can be traversed for the branch current computations sequentially from branch 12 to branch 1.

In an embodiment, at the q-th iteration, based on the Kirchhoff's Current Law (KCL), the current in the i-th branch (the branch connected to the i-th node according to the numbering system described above) can be calculated as, $$I_i^q = \left(\frac{S_i}{V_i^{q-1}}\right)^* + I_k^q \tag{1}$$

where $I_i^q$ represents the current of the i-th branch, $I_k^q$ represents a current of a k-th branch emanating from the i-th node and connected with a k-th node, k represent the numbers of the respective branches (such as a, b, c, and the like), $V_i^{q-1}$ represents the nodal voltage of the i-th node (the node numbered with i) determined at the (q−1)-th iteration, $S_i$ represents a nodal injection power at the i-th node, and asterisk symbol ('*') represents complex conjugate. The current $I_k^q$ of the k-th branch is already available because the k-th branch is at a lower layer than the i-th branch and is already traversed previously. When at the first iteration where q=1, $V_i^{q-1}$ represents the initial nodal voltage at the i-th node that is determined at S220. The quantities I and V in expression (1) stand for complex current and voltage in per unit quantities, respectively.

For example, at the q-th iteration, according to the expression (1), the current of the 6th branch at the 6th node of the radial distribution network 100 shown in FIG. 2 can be calculated as $$I_6^q = \left(\frac{S_6}{V_6^{q-1}}\right)^* + \sum_{k=9,10,11} I_k^q \quad (2)$$

For example, at the q-th iteration, according to the expression (1), the current of the 10th branch at the 10th node of the radial distribution network 100 shown in FIG. 2 can be calculated as $$I_{10}^q = \left(\frac{S_{10}}{V_{10}^{q-1}}\right) \quad (3)$$

where the branch current equals the nodal injection current because the 10th node is a terminal node and there is no branch emanating from the 10-th node. $S_i$ represents a nodal injection power at the i-th node.

In various embodiments, the current in the i-th branch can be calculated as, $$I_i^q = I_{Ni}^q + \sum_{k=a,b,c,j*\,etc} I_k^q$$

where $I_{Ni}^q$ is a nodal injection current. In the expression (1), the nodal injection current is calculated as $$\left(\frac{S_i}{V_i^{q-1}}\right)^*.$$

In an embodiment, the nodal injection current $I_{Ni}^q$ can also be calculated as $$I_{Ni}^q = Y_i V_i^{q-1} \quad (4)$$

where $Y_i$ represents an admittance of shunt elements at the i-th node such as shunt elements associated with the i-th node or shunt elements associated with the branches connected to the i-th node. The quantity Y stands for a complex power and admittance quantity in per unit.

In an embodiment, the nodal injection power $S_i$ can be determined according to an injection power of a generator connected to the i-th node and a load power of loads connected to the i-th node. For example, the nodal injection power $S_i$ can be an injection power $S_{i,gen}$ of a generator connected to the i-th node minus a load power $S_{i,L}$ of loads connected to the i-th node. Accordingly, the nodal injection current $I_{Ni}^q(V_i^{q-1})$ can be calculated as $$I_{Ni}^q = -\left(\frac{S_{i,gen} - S_{i,L}}{V_i^{q-1}}\right)^* \quad (5)$$

In an example, no generators are configured in the radial distribution network, and currents of shunt elements are ignored for power load determination. Accordingly, the nodal injection current $I_{Ni}^q(V_i^{q-1})$ can be calculated as $$I_{Ni}^q = \left(\frac{S_{i,L}}{V_i^{q-1}}\right)^* \quad (6)$$

In the above example, the current in the i-th branch can be calculated as $$I_i^q = \left(\frac{S_{i,L}}{V_i^{q-1}}\right)^* + \sum_{k=a,b,c,j*\,etc} I_k^q \quad (7)$$

At S240, the forward sweep can be performed to determine voltages of the nodes (except the root node) in the radial distribution network 100 based on the branch currents determined during the backward sweep at S230. For example, computations of the nodal voltages can start from the nodes neighboring the root node and move forward (downward) until the nodes at the bottom layer are processed. For example, in the FIG. 2 example, the nodes of the radial distribution network 100 can be traversed for nodal voltage computations sequentially from node 1 to node 12.

In an embodiment, at the q-th iteration, based on the Kirchhoff's Voltage Law (KVL), the voltage at the i-th node can be calculated as $$V_i^q = V_j^q - I_i^q Z_{ij} \quad (8)$$

Where $V_i^q$ represents the nodal voltage of the i-th node, $V_j^q$ represents the nodal voltage of the upper-layer neighboring node of the i-th node numbered with j, and $Z_{ij}$ represents an impedance between the j-th node and the i-th node. The current $I_i^q$ is the current between the j-th node and the i-th node and is determined during the backward sweep at S230. When the nodes neighboring the root node are under processing, $V_j^q$ represents the nodal voltage of the slack bus which is specified in the data received at S210.

At S250, it is determined whether the convergence is achieved according to a convergence criterion. In various embodiments, various convergence criteria may be adopted. For example, a maximum voltage or power difference at a node between the present and the previous iterations among the nodes (except the root node) of the radial distribution network 100 can be compared with a threshold. When the maximum voltage or power difference is smaller than or equal to the threshold, the process 200 can proceeds to S299 and terminates at S299. Otherwise, the process 100 can return to S230 to start a next round of iteration.

III. Enhanced Backward/Forward Sweep Load Flow Method

In an embodiment, an EBFS based load flow analysis process can include a current updating operation and a voltage updating operation that are performed after backward and within forward sweeps process in each round of iteration. For example, in the current updating operation at each iteration, branch currents can be updated (or determined) based on nodal voltages determined during the forward sweep at the same iteration, and nodal voltages can subsequently be updated (or determined) based on the updated branch currents. In this way, the number of the iterations can be reduced, and the convergence of the load flow analysis process can be accelerated. The accuracy of the load flow analysis results can be improved or maintained at the same level compared with a normal BFS based load flow analysis.

Figure 3:
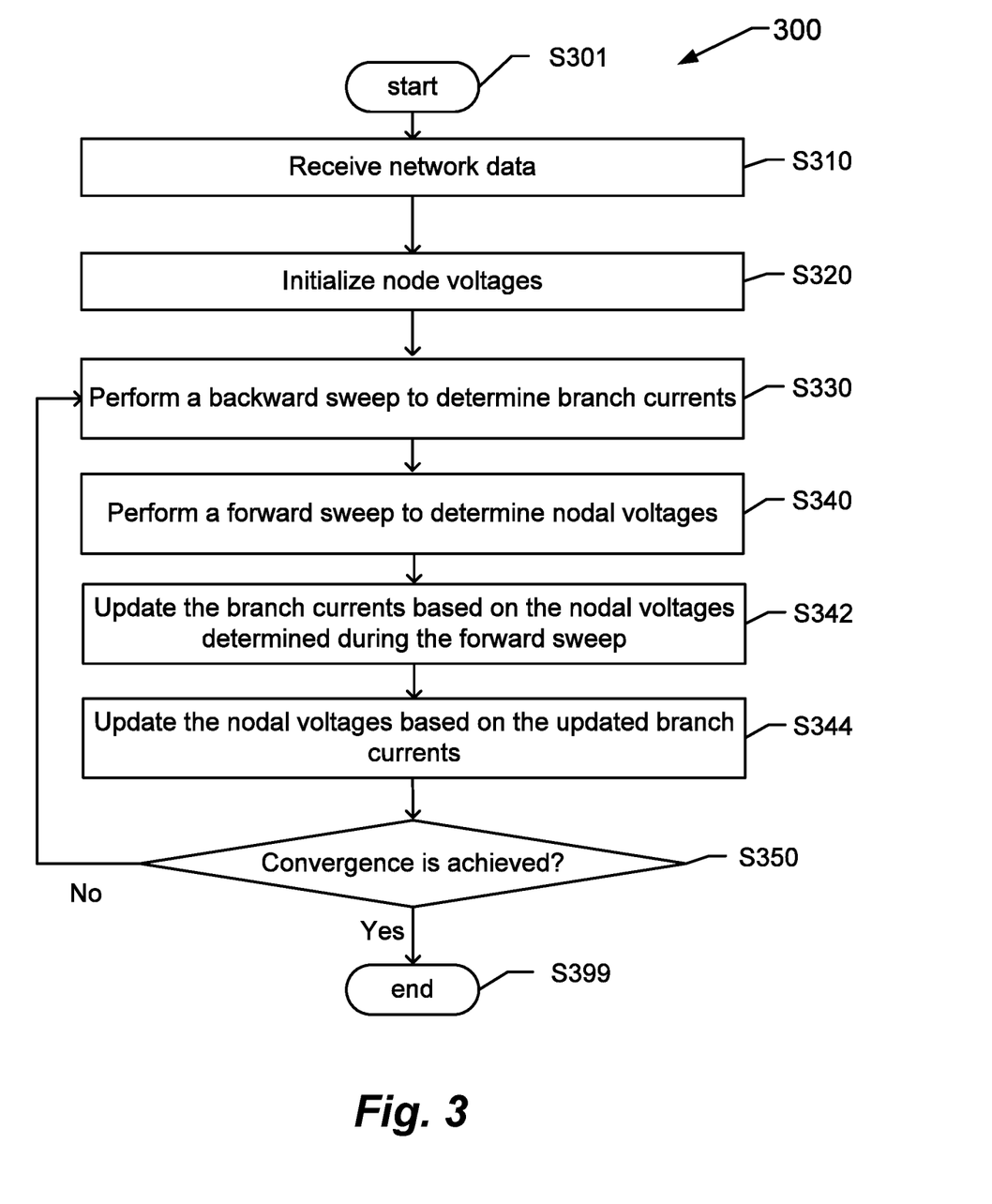
FIG. 3 shows an exemplary enhanced backward/forward weep (EBFS) based load flow analysis process 300 according to an embodiment of the disclosure.

FIG. 3 shows an exemplary EBFS based load flow analysis process 300 according to an embodiment of the disclosure. The process 300 can be performed over the radial distribution network 100 to determine AC power quantities indicating a performance of the radial distribution network 100. Steps of S310-S340 and S350 of the process 300 can be similar to the steps of S210-S250 of the process 200, respectively. However, two additional steps of S342 and S344 are included in the process 300.

The process 300 can start from S301, and proceed with the steps of S310-S340 being performed. For example, at S330, a backward sweep of a q-th iteration can be performed to determine the branch currents in the radial distribution network 100, for example, according to the expressions (1), (4), (5), (6), or (7) in various embodiments. At S340, a forward sweep of the q-th iteration can be performed to determine the nodal voltages of the radial distribution network based on the nodal voltages determined during the backward sweep of the q-th iteration, for example, according to the expression (8).

Subsequently, at S342, the branch currents of the radial distribution network 100 can be updated (or determined) based on the nodal voltages determined during the forward sweep of the q-th iteration. For example, in order to updating a branch current of the i-th branch connected to the i-th node, a nodal injection current of the i-th node can first be updated based on the nodal voltage determined during the forward sweep of the q-th iteration. Then, the updated nodal injection current can be added to the currents of branches emanating from the i-th node (that are determined during the backward sweep of the q-th iteration) to determine the updated branch current of the i-th branch.

In an embodiment, corresponding to the embodiment associated with the expression (1), the undated branch current of the i-th branch at the q-th iteration can be determined according to $$I_i^{q'} = I_{Ni}^{q'} + \sum_{k=a,b,c_{j*} \text{ etc}} I_k^q = \left(\frac{S_i}{V_i^q}\right)^* + \sum_{k=a,b,c_{j*} \text{ etc}} I_k^q \quad (9)$$

where $I_i^{q'}$ represents the updated branch current of the i-th branch connected to the i-th node, $I_{Ni}^{q'}$ represents the updated nodal injection current of the i-th node that is updated based on the nodal voltage $V_i^q$ that is obtained from the forward sweep of the q-th iteration, and $\Sigma_{k=a,b,c, \ldots \text{ etc}} I_k^q$ represents the set of branch currents of the braches emanating from the i-th node. The set of branch currents $\Sigma_{k=a,b,c, \ldots \text{ etc}} I_k^q$ are determined during the backward weep of the i-th iteration.

In an embodiment, corresponding to the embodiment associated with the expression (4), the updated nodal injection current $I_{Ni}^{q'}$ can be calculated as $$I_{Ni}^{q'} = Y_1 V_i^q. \quad (10)$$

Compared with the expression (4), the nodal voltage of the (q−1)-th iteration, $V^{q-1}_i$, is replaced with the nodal voltage of the q-th iteration, $V_i^q$.

In an embodiment, corresponding to the embodiment associated with the expression (5), the updated nodal injection current $I_{Ni}^{q'}$ can be calculated as $$I_{Ni}^{q'} = -\left(\frac{S_{i,gen} - S_{i,L}}{V_i^q}\right)^* \quad (11)$$

In an embodiment, corresponding to the embodiment associated with the expression (6), the updated nodal injection current $I_{Ni}^{q'}$ can be calculated as $$I_{Ni}^{q'} = \left(\frac{S_{i,L}}{V_i^q}\right)^* \quad (12)$$

In an embodiment, corresponding to the embodiment associated with the expression (7), the updated nodal injection current $I_{Ni}^{q'}(V_i^q)$ can be calculated as $$I_i^{q'} = \left(\frac{S_{i,L}}{V_i^q}\right)^* + \sum_{k=a,b,c_{j*} \text{ etc}} I_k^q \quad (13)$$

At S344, the nodal voltages of the radial distribution network 100 can be updated (or determined) based on the branch currents updated at S342. For example, an updated nodal voltage of the i-th node can be a nodal voltage of an upper layer neighboring node of the i-th node determined during the forward sweep of the q-th iteration minus a voltage drop over the i-th branch calculated based on the branch current updated at S342.

In an embodiment, the updated nodal voltage of the i-th node at the q-th iteration can be determined according to $$V_i^{q'} = V_j^q - I_i^{q'} Z_{ij} \quad (14)$$

where $V_i^{q'}$ represents the updated nodal voltage of the i-th node, $I_i^{q'}$ is the branch current of the i-th branch updated at S342, $V_j^q$ is the nodal voltage of the j-th node (that is an upper neighboring node of the i-th node) determined during the forward sweep of the q-th iteration, and $Z_{ij}$ is the impedance of the i-th branch between the j-th node and the i-th node.

After the branch current and nodal voltage updating operations at steps of S342 and S344, the step of S350 can be performed followed by a next iteration starting from S330 or a termination of the process 300 at S399. When the next iteration is performed, the updated nodal voltages determined at S344 can be used as input for the next iteration. For example, the updated nodal voltages can be used in place of the nodal voltages determined during the forward sweep of the q-th iteration. In an alternative embodiment, the convergence determination at S350 can be arranged at a step between S340 and S342.

IV. Examples

BFS and EBFS based load flow analysis algorithms were developed and tested using IEEE distribution systems of 5, 7, 11, 25, 28, 30, 33, 34, and 69 buses. The simulation results demonstrate the effectiveness of the EBFS based load flow approach compared with the BFS based load flow method. The simulation results are shown from FIG. 4 to FIG. 11.

Figure 4:
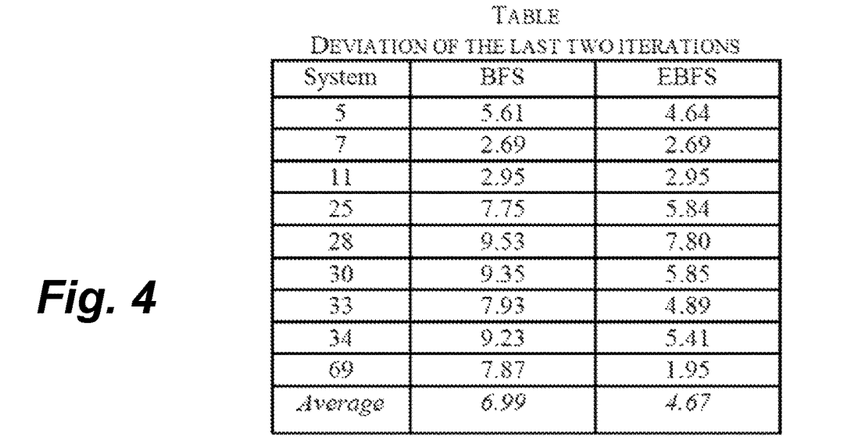
FIG. 4 shows a table 400 of deviations of the last two iterations of BFS and EBFS methods.

FIG. 4 shows a table 400 of deviations of the last two iterations of the BFS and EBFS methods. In FIG. 4, the tested IEEE distribution systems are listed in the first column, and the deviations of the last two iterations of the BFS method and the EBFS method are listed in the second and third column, respectively. Averaged values are shown at the last row. The deviations between the last two iterations can indicate an accuracy of the respective BFS or EBFS method. As shown, the EBFS method is superior in accuracy by 33% in average compared with the BFS method.

Figure 5:
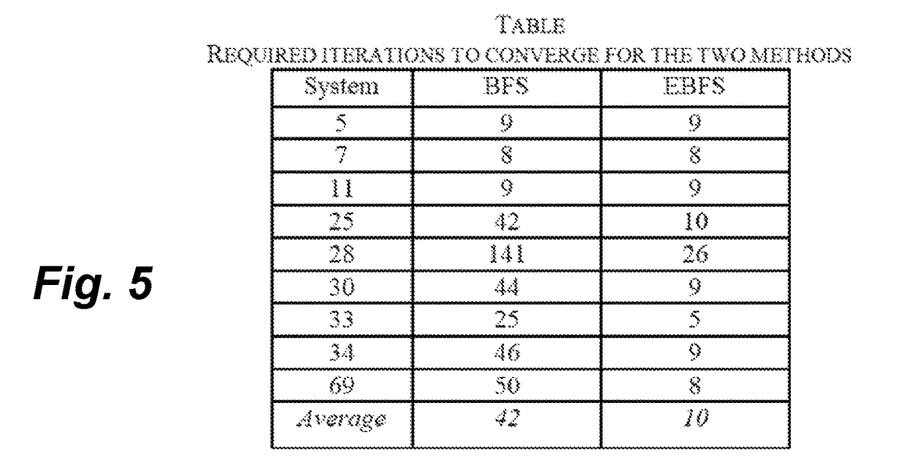
FIG. 5 shows a table of required iterations to converge corresponding to the BFS and EBFS methods.

FIG. 5 shows a table of required iterations to converge corresponding to the BFS and EBFS methods. In FIG. 5, the tested IEEE distribution systems are listed in the first column, and the numbers of the required iterations of the BFS method and the EBFS method are listed in the second and third column, respectively. Averaged values are shown at the last row. As shown, the average iterations required to converge of the BFS method is approximately five times that of the EBFS method.

Figure 6:
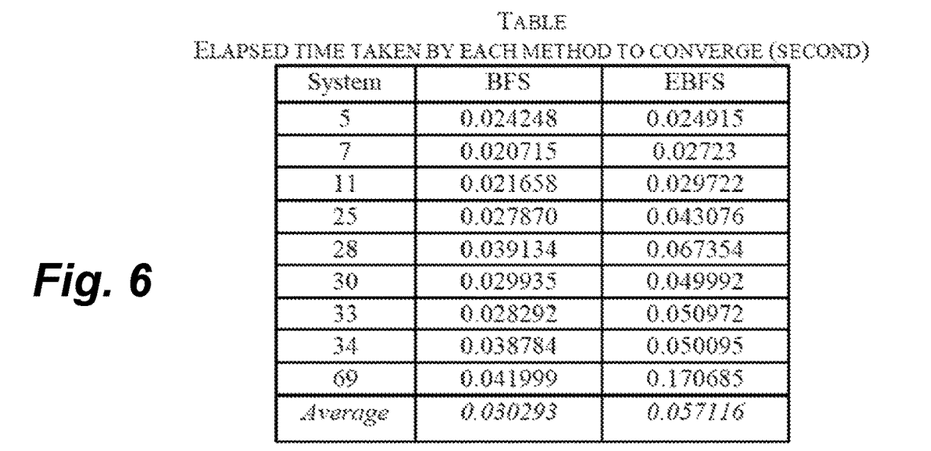
FIG. 6 shows elapsed time taken by the BFS method and the EBFS method.
Figure 7:
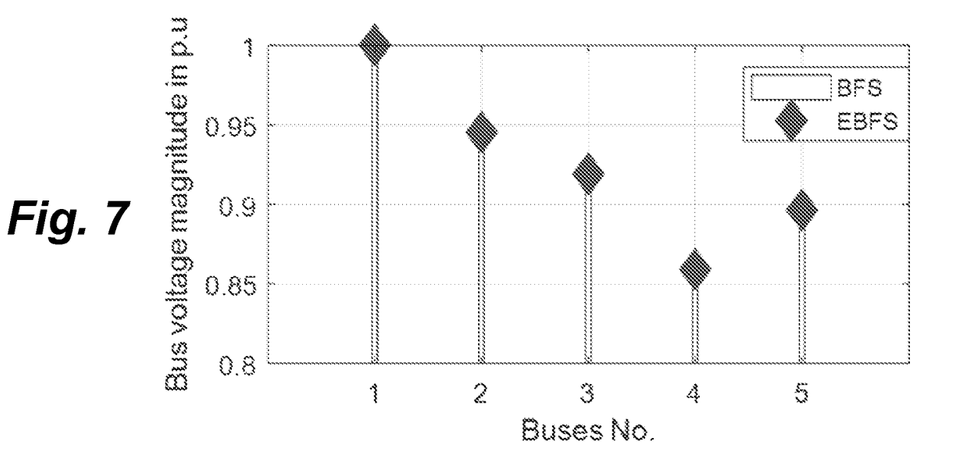
FIGS. 7-15 show comparisons of voltage profiles resulting from algorithms of the BFS method and the EBFS method.
Figure 8:
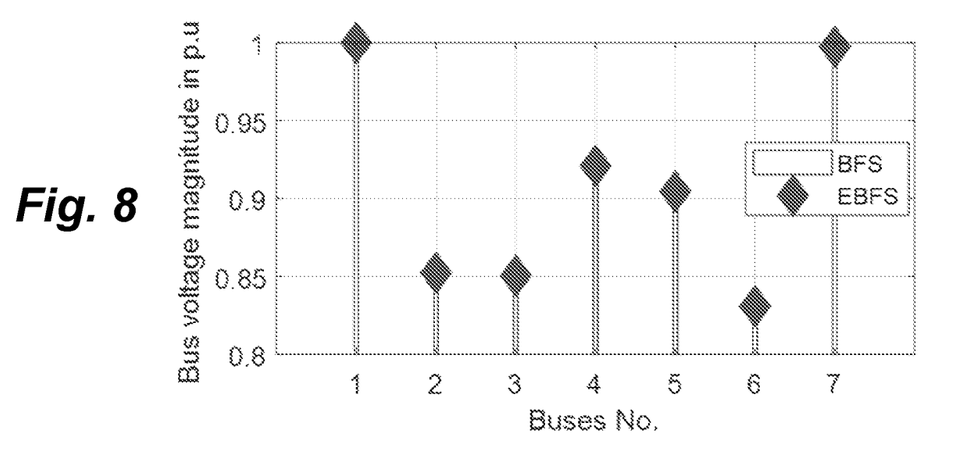
Figure 9:
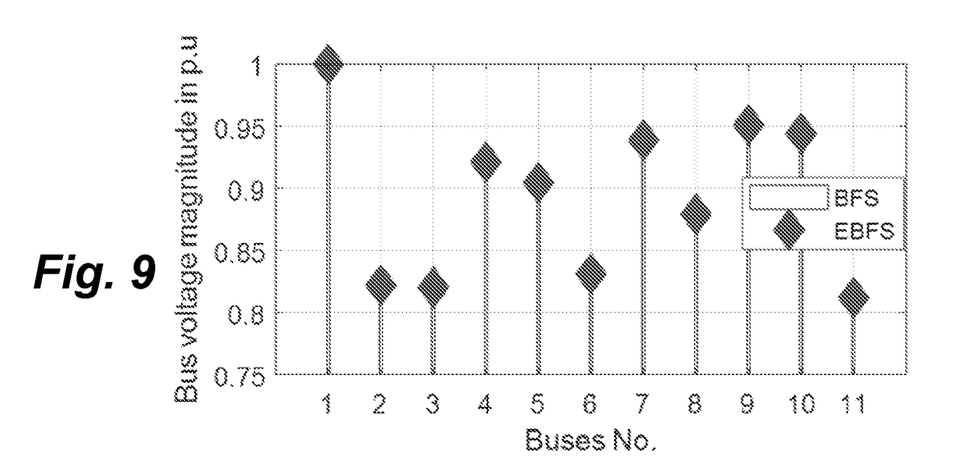
Figure 10:
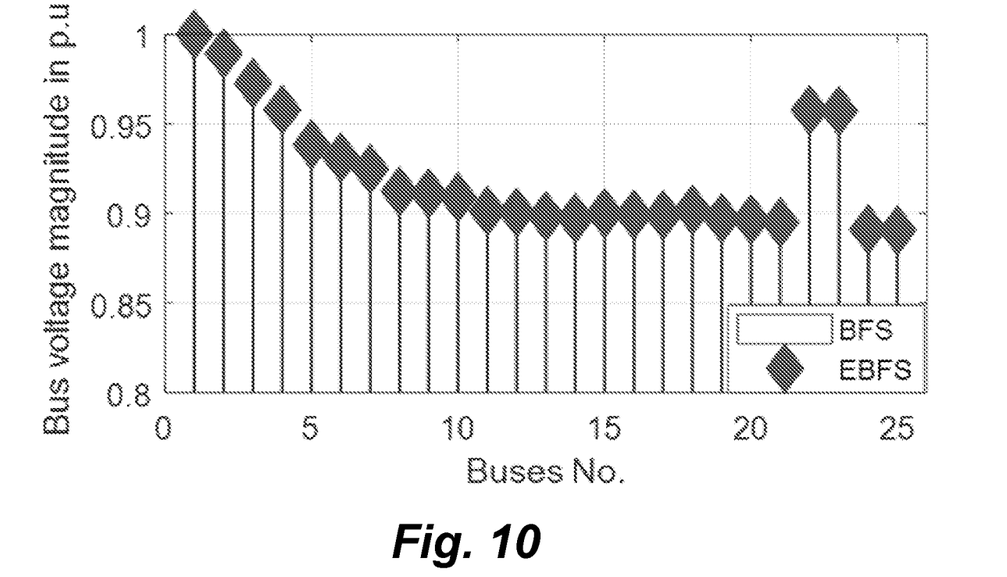
Figure 11:
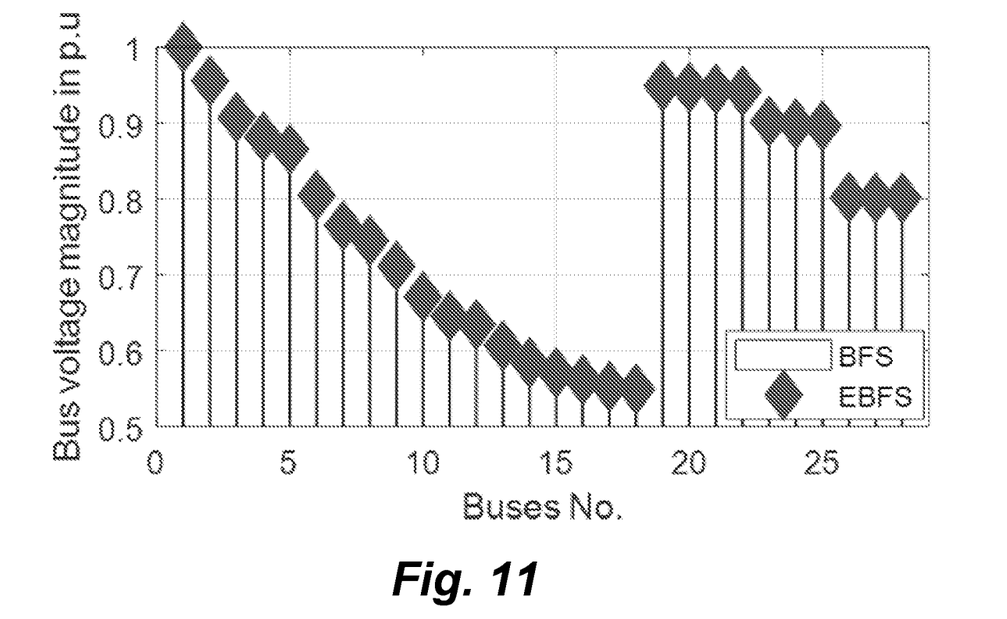
Figure 12:
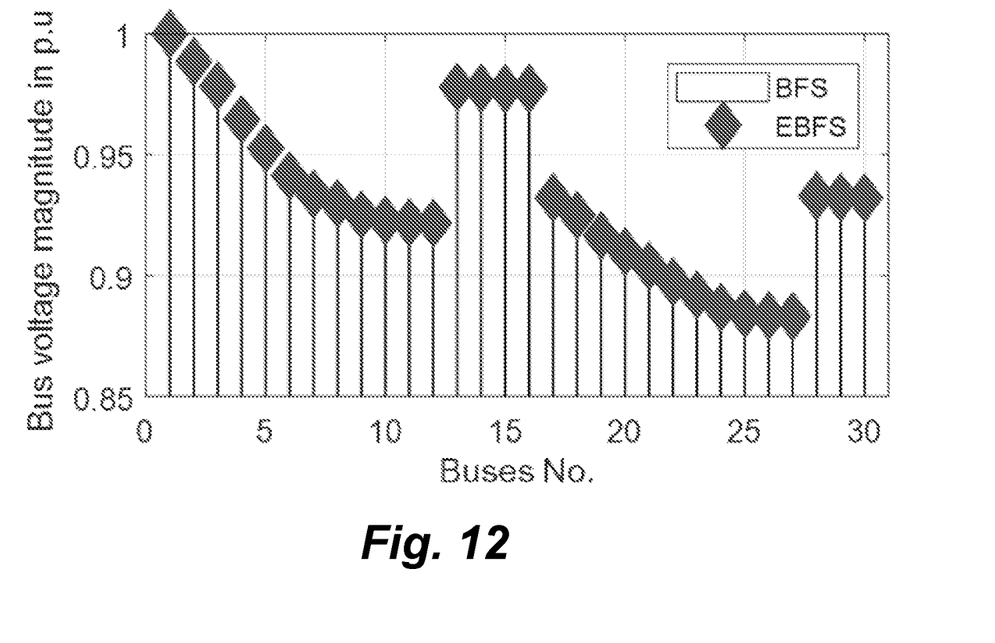
Figure 13:
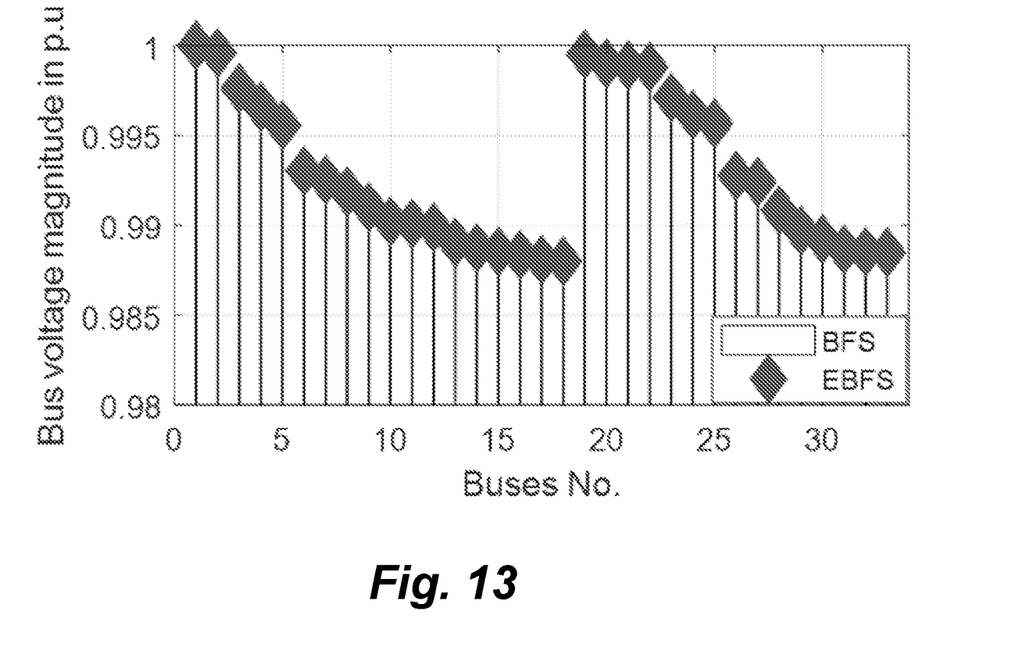
Figure 14:
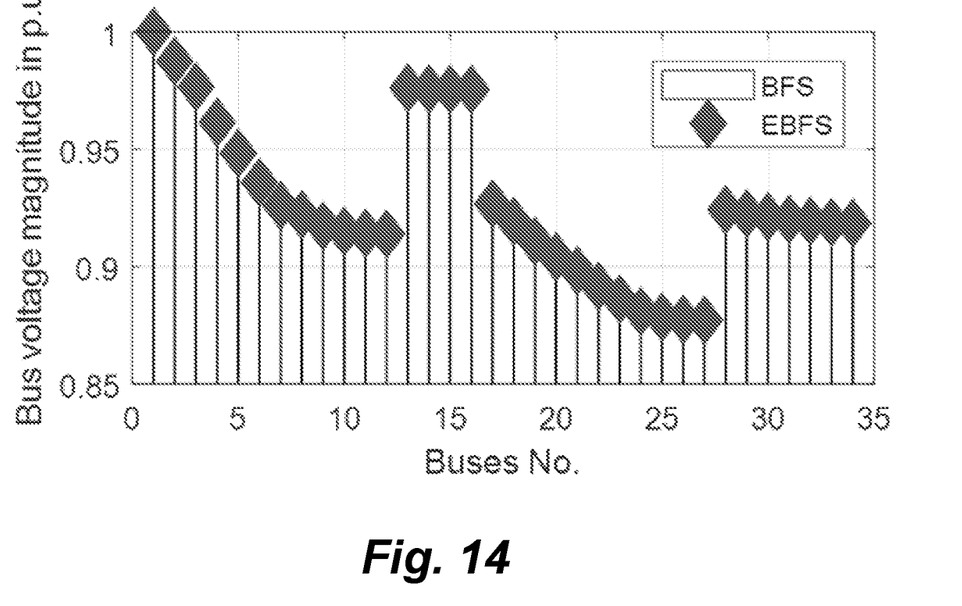
Figure 15:
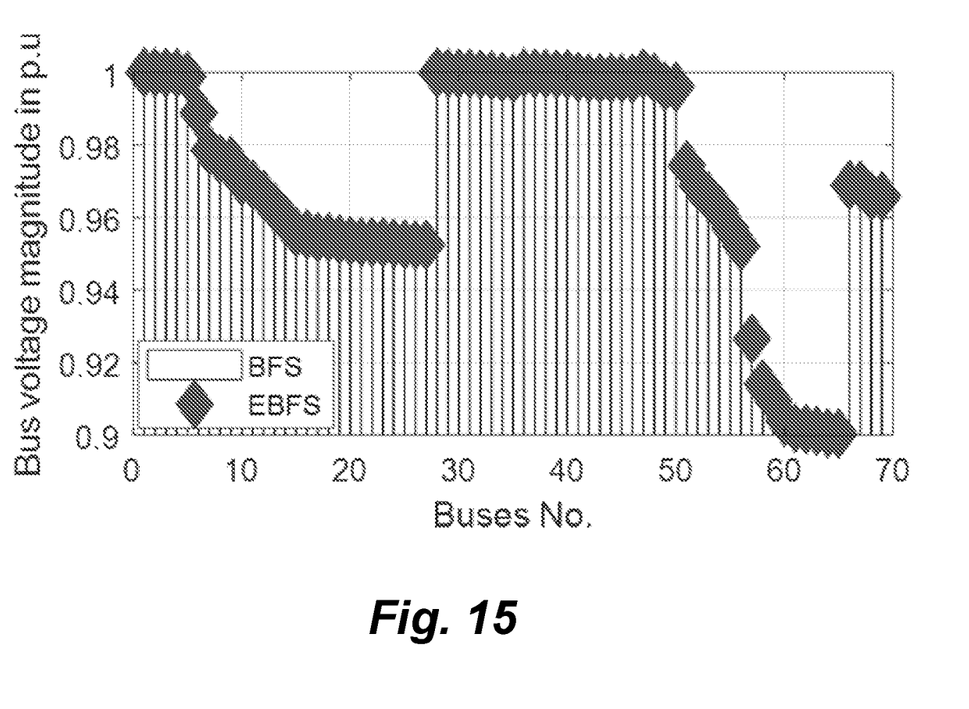

FIG. 6 shows elapsed time taken by the BFS method and the EBFS method. In FIG. 6, the tested IEEE distribution systems are listed in the first column, and the time consumed by the algorithms of the BFS method and the EBFS method are listed in the second and third column, respectively. Averaged values are shown at the last row. As shown, the time taken by the EBFS method is longer than that taken by the BFS method.

FIGS. 7-15 show comparisons of voltage profiles resulting from the algorithms of the BFS method and the EBFS method. FIGS. 7-15 correspond to IEEE distribution systems of 5, 7, 11, 25, 28, 30, 33, 34, and 69 buses, respectively. In each of the FIGS. 7-15, numbers of the buses are sequentially listed in the horizontal axis starting with the bus No. 1, and bus voltage magnitudes in pu are represented by the vertical axis. The bus voltage magnitudes resulting from the tests of both the BFS and EBFS methods corresponding to an IEEE distribution system are shown in the same figure. As shown, the results of the BFS and EBFS methods are exactly the same for all the 9 IEEE distribution systems, which proves the effectiveness of the EBFS method.

V. Computer System

Figure 16:
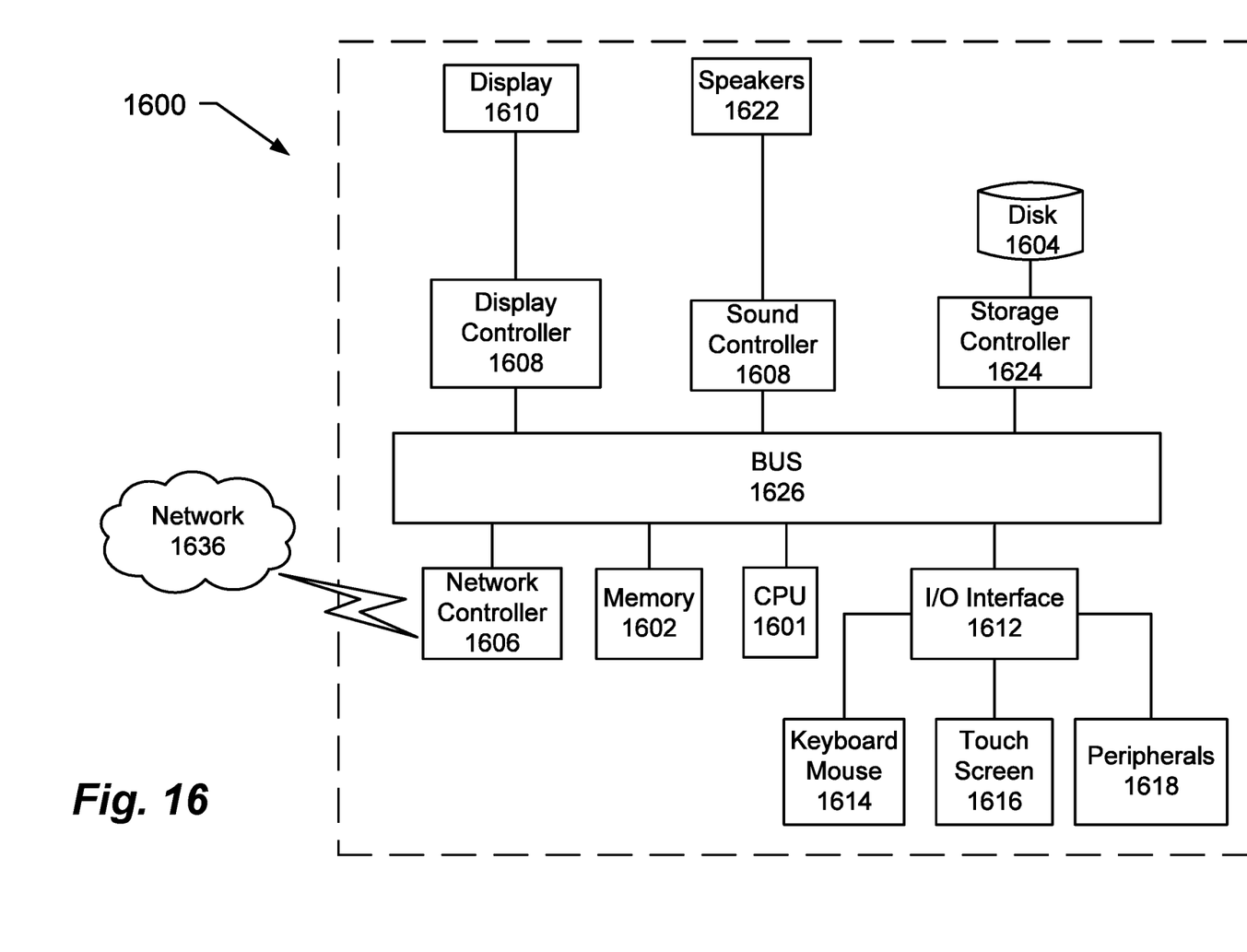
FIG. 16 shows a computer system according to embodiments of the disclosure.

FIG. 16 shows a computer system 1600 according to an embodiment of the disclosure. The EBFS based load analysis techniques described herein can be implemented with the computer system 1600. The computer system 1600 can include processing circuitry such as a CPU 1601. In one example, the processing circuitry can be configured to perform the process 300 in the FIG. 3 example. The computer system can further include non-transitory storage media. In one example, the non-transitory storage media can be configured to store instructions that, when executed by the CPU 1601, can cause the CPU 1601 to perform the process 300. For example, the non-transitory storage media can include a memory 1602, and a storage medium disk 1604 such as a hard drive (HDD) or portable storage medium or may be stored remotely. In addition, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device.

Further, the claimed advancements may be provided as a utility application, background daemon, or component of an operating system, or combination thereof, executing in conjunction with CPU 1601 and an operating system such as Microsoft Windows 10, UNIX, Solaris, LINUX, Apple MAC-OS and other systems known to those skilled in the art.

For example, the CPU 1601 may be a xenon or Core processor from Intel of America or an Opteron processor from AMD of America, or may be other processor types that would be recognized by one of ordinary skill in the art. Alternatively, the CPU 1601 may be implemented on an FPGA, ASIC, PLD or using discrete logic circuits, as one of ordinary skill in the art would recognize. Further, CPU 1601 may be implemented as multiple processors cooperatively working in parallel to perform the instructions of the inventive processes described above.

The computer system 1600 can include a network controller 1606, such as an Intel Ethernet PRO network interface card from Intel Corporation of America, for interfacing with network 1636. As can be appreciated, the network 1636 can be a public network, such as the Internet, or a private network such as an LAN or WAN network, or any combination thereof and can also include PSTN or ISDN sub-networks. The network 1636 can also be wired, such as an Ethernet network, or can be wireless such as a cellular network including EDGE, 3G and 4G wireless cellular systems. The wireless network can also be WiFi, Bluetooth, or any other wireless form of communication that is known.

The computer system 1600 can further include a display controller 1608, such as a NVIDIA GeForce GT16 or Quadro graphics adaptor from NVIDIA Corporation of America for interfacing with display 1610, such as a Hewlett Packard HPL2445w LCD monitor. A general purpose I/O interface 1612 interfaces with a keyboard and/or mouse 1614 as well as a touch screen panel 1616 on or separate from display 1610. General purpose I/O interface also connects to a variety of peripherals 1618 including printers and scanners, such as an OfficeJet or DeskJet from Hewlett Packard.

A sound controller 1620 is also provided in the computer 1600, such as Sound Blaster X-Fi Titanium from Creative, to interface with speakers/microphone 1622 thereby providing sounds and/or music.

The general purpose storage controller 1624 connects the storage medium disk 1604 with communication bus 1626, which may be an ISA, EISA, VESA, PCI, or similar, for interconnecting all of the components of the computer system 1600. A description of the general features and functionality of the display 1610, keyboard and/or mouse 1614, as well as the display controller 1608, storage controller 1624, network controller 1606, sound controller 1620, and general purpose I/O interface 1612 is omitted herein for brevity as these features are known.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method of backward/forward sweep based power flow analysis, comprising:
    receiving data of a radial distribution network, the radial distribution network including nodes and branches that are sequentially numbered and belong to different layers, the data including information describing a topology of the radial distribution, impedance of each of the branches, and admittances of shunt elements associated with each of the branches or the nodes;

performing a current iteration of the power flow analysis on the radial distribution network, including:

performing, by processing circuitry, a backward sweep to determine first branch currents of the radial distribution network based on the data and nodal voltages determined at a last iteration of the power flow analysis on the radial distribution network;

performing, by the processing circuitry, a forward sweep to determine first nodal voltages of the radial distribution network based on the data and the first branch currents;

determining, by the processing circuitry, second branch currents of the radial distribution network based on the data and the first nodal voltages, wherein the second branch current of the respective node is a sum of (i) a nodal injection current of the respective node that is updated based on the first nodal voltage of the respective node, and (ii) if available, the first branch currents of branches emanating from the respective node; and determining second nodal voltages of the radial distribution network based on the data and the second branch currents, wherein the second nodal voltage of the respective node is the first nodal voltage of an upper layer node neighboring the respective node minus a voltage drop caused by the second branch current from the upper layer node to the respective node;

operating the radial distribution network at the second nodal voltages and the second branch currents when a maximum voltage or power difference at one of the nodes between the present iteration and a previous iteration among the nodes is less than a convergence threshold; and performing a next iteration of the power flow analysis on the radial distribution network according to the second nodal voltages when the maximum voltage or power difference exceeds the convergence threshold.

2. The method of claim 1, wherein the determining the second branch currents comprises:

determining the second branch current at a q-th iteration according to, $$I_i^{q'} = I_{Ni}^{q'} + \sum_{k=a,b,c,\ldots *etc} I_k^q$$

where $I_i^{q'}$ represents the second branch current of the i-th branch connected to the i-th node, $I_{Ni}^{q'}$ represents the nodal injection current of the i-th node that is updated based on the first nodal voltage of the i-th node represented as $V_i^q$, and $\Sigma_{k=a,b,c,\ldots etc} I_k^q$ represents the branch currents of branches emanating from the i-th node.

3. The method of claim 2, wherein the updated nodal injection current of the i-th node is determined according to, $$I_{Ni}^{q'} = \left(\frac{S_i}{V_i^q}\right)^*$$

where $S_i$ represents a nodal injection power at the i-th node, and * represents complex conjugate.

4. The method of claim 3, wherein the nodal injection power $S_i$ at the i-th node is determined according to an injection power of a generator connected to the i-th node and a load power of loads connected to the i-th node.

5. The method of claim 1, wherein the determining the second branch currents comprises:

determining the second branch current at a q-th iteration according to, $$I_i^{q'} = \left(\frac{S_{i,L}}{V_i^q}\right)^* + \sum_{k=a,b,c,\ldots *etc} I_k^q$$

where $I_i^{q'}$ represents the second branch current of the i-th branch connected to the i-th node, $S_{i,L}$ represents a load power of loads connected to the i-th node, $V_i^q$ represents the first nodal voltage of the i-th node, * represents complex conjugate, and $\Sigma_{k=a,b,c,\ldots etc} I_k^q$ represents the branch currents of braches emanating from the i-th node.

6. The method of claim 1, wherein the determining the second nodal voltages comprises:

determining the second nodal voltage at a q-th iteration according to, $$V_i^{q'} = V_j^q - I_i^{q'} Z_{ij}$$

where $V_i^{q'}$ represents the second nodal voltage of the i-th node, $I_i^{q'}$ is the second branch current of the i-th branch connected to the i-th node, $V_j^q$ is the first nodal voltage of the j-th node that is an upper neighboring node of the i-th node, and $Z_{ij}$ is an impedance of the i-th branch between the j-th node and the i-th node.

7. The method of claim 1, wherein the radial distribution network is an extended radial distribution network where multi-terminal lines exist.

8. The method of claim 1, wherein the nodes and the branches of the radial distribution network are sequentially numbered and belong to first to last layers, the first nodal voltages of the radial distribution network are determined based on the first branch currents in a first order from the first layer to the last layer, and the second nodal voltages of the radial distribution network are determined based on the second branch currents in a second order different from the first order.

9. A non-transitory computer-readable medium storing a program executable by a processor to perform a method of backward/forward sweep based power flow analysis, the method comprising:

receiving data of a radial distribution network, the radial distribution network including nodes and branches that are sequentially numbered and belong to different layers, the data including information describing a topology of the radial distribution, impedance of each of the branches, and admittances of shunt elements associated with each of the branches or the nodes;

performing a current iteration of the power flow analysis on the radial distribution network, including:

performing a backward sweep to determine first branch currents of the radial distribution network based on the data and nodal voltages determined at a last iteration of the power flow analysis on the radial distribution network;

performing a forward sweep to determine first nodal voltages of the radial distribution network based on the data and the first branch currents;

determining second branch currents of the radial distribution network based on the data and the first nodal voltages, wherein the second branch current of the respective node is a sum of (i) a nodal injection current of the respective node that is updated based on the first nodal voltage of the respective node, and
(ii) if available, the first branch currents of branches emanating from the respective node; and determining second nodal voltages of the radial distribution network based on the data and the second branch currents, wherein the second nodal voltage of the respective node is the first nodal voltage of an upper layer node neighboring the respective node minus a voltage drop caused by the second branch current from the upper layer node to the respective node;

operating the radial distribution network at the second nodal voltages and the second branch currents when a maximum voltage or power difference at one of the nodes between the present iteration and a previous iteration among the nodes is less than a convergence threshold; and performing a next iteration of the power flow analysis on the radial distribution network according to the second nodal voltages when the maximum voltage or power difference exceeds the convergence threshold.

10. The non-transitory computer-readable medium of claim 9, wherein the determining the second branch currents comprises:

determining the second branch current at a q-th iteration according to, $$I_i^{q'} = I_{Ni}^{q'} + \sum_{k=a,b,c,\ldots*etc} I_k^q$$

where $I_i^{q'}$ represents the second branch current of the i-th branch connected to the i-th node, $I_{Ni}^{q'}$ represents the nodal injection current of the i-th node that is updated based on the first nodal voltage of the i-th node represented as $V_i^q$, and $\Sigma_{k=a,b,c,\ldots etc} I_k^q$ represents the branch currents of branches emanating from the i-th node.

11. The non-transitory computer-readable medium of claim 10, wherein the updated nodal injection current of the i-th node is determined according to, $$I_{Ni}^{q'} = \left(\frac{S_i}{V_i^q}\right)^*$$

where $S_i$ represents a nodal injection power at the i-th node, and * represents complex conjugate.

12. The non-transitory computer-readable medium of claim 11, wherein the nodal injection power $S_i$ at the i-th node is determined according to an injection power of a generator connected to the i-th node and a load power of loads connected to the i-th node.

13. The non-transitory computer-readable medium of claim 9, wherein the determining the second branch currents comprises:

determining the second branch current at a q-th iteration according to, $$I_i^{q'} = \left(\frac{S_{i,L}}{V_i^q}\right)^* + \sum_{k=a,b,c,\ldots*etc} I_k^q$$

where $I_i^{q'}$ represents the second branch current of the i-th branch connected to the i-th node, $S_{i,L}$ represents a load power of loads connected to the i-th node, $V_i^q$ represents the first nodal voltage of the i-th node, * represents complex conjugate, and $\Sigma_{k=a,b,c,\ldots etc} I_k^q$ represents the branch currents of braches emanating from the i-th node.

14. The non-transitory computer-readable medium of claim 9, wherein the determining the second nodal voltages comprises:

determining the second nodal voltage at a q-th iteration according to, $$V_i^{q'} = V_j^q - I_i^{q'} Z_{ij}$$

where $V_i^{q'}$ represents the second nodal voltage of the i-th node, $I_i^{q'}$ is the second branch current of the i-th branch connected to the i-th node, $V_j^q$ is the first nodal voltage of the j-th node that is an upper neighboring node of the i-th node, and $Z_{ij}$ is an impedance of the i-th branch between the j-th node and the i-th node.

15. The non-transitory computer-readable medium of claim 9, wherein the radial distribution network is an extended radial distribution network where multi-terminal lines exist.

16. The non-transitory computer-readable medium of claim 9, wherein the nodes and the branches of the radial distribution network are sequentially numbered and belong to first to last layers, the first nodal voltages of the radial distribution network are determined based on the first branch currents in a first order from the first layer to the last layer, and the second nodal voltages of the radial distribution network are determined based on the second branch currents in a second order different from the first order.

17. An apparatus of backward/forward sweep based power flow analysis, comprising circuitry configured to:

receive data of a radial distribution network, the radial distribution network including nodes and branches that are sequentially numbered and belong to different layers, the data including information describing a topology of the radial distribution, impedance of each of the branches, and admittances of shunt elements associated with each of the branches or the nodes;

perform a current iteration of the power flow analysis on the radial distribution network, including:
perform a backward sweep to determine first branch currents of the radial distribution network based on the data and nodal voltages determined at a last iteration of the power flow analysis on the radial distribution network;
perform a forward sweep to determine first nodal voltages of the radial distribution network based on the data and the first branch currents;
determine second branch currents of the radial distribution network based on the data and the first nodal voltages, wherein the second branch current of the respective node is a sum of (i) a nodal injection current of the respective node that is updated based on the first nodal voltage of the respective node, and (ii) if available, the first branch currents of branches emanating from the respective node; and
determine second nodal voltages of the radial distribution network based on the data and the second branch currents, wherein the second nodal voltage of the respective node is the first nodal voltage of an upper layer node neighboring the respective node minus a voltage drop caused by the second branch current from the upper layer node to the respective node;

operate the radial distribution network at the second nodal voltages and the second branch currents when a maximum voltage or power difference at one of the nodes between the present iteration and a previous iteration among the nodes is less than a convergence threshold; and perform a next iteration of the power flow analysis on the radial distribution network according to the second nodal voltages when the maximum voltage or power difference exceeds the convergence threshold.

18. The apparatus of claim 17, wherein the circuitry is further configured to:

determine the second branch current at a q-th iteration according to, $$I_i^{q'} = I_{Ni}^{q'} + \sum_{k=a,b,c,\ldots,etc} I_k^q$$

where $V_i^{q'}$ represents the second branch current of the i-th branch connected to the i-th node, $I_{Ni}^{q'}$ represents the nodal injection current of the i-th node that is updated based on the first nodal voltage $V_i^q$ of the i-th node, and $\Sigma_{k=a,b,c,\ldots etc} I_k^q$ represents the branch currents of braches emanating from the i-th node.

19. The apparatus of claim 18, wherein the updated nodal injection current of the i-th node is determined according to, $$I_{Ni}^{q'} = \left(\frac{S_i}{V_i^q}\right)^*$$

where $S_i$ represents a nodal injection power at the i-th node, and * represents complex conjugate.

20. The apparatus of claim 17, wherein the nodes and the branches of the radial distribution network are sequentially numbered and belong to first to last layers, the first nodal voltages of the radial distribution network are determined based on the first branch currents in a first order from the first layer to the last layer, and the second nodal voltages of the radial distribution network are determined based on the second branch currents in a second order different from the first order.

* * * * *